(12) United States Patent
Chan et al.

(10) Patent No.: US 8,143,770 B2
(45) Date of Patent: Mar. 27, 2012

(54) LED BULB STRUCTURE HAVING INSERTION END, AND/OR HEAT DISSIPATION ELEMENT, AND/OR HEAT-AND-ELECTRICITY SEPARATED ELEMENT

(75) Inventors: Cheng-Wei Chan, Taipei (TW); Ming-Hung Chen, Taipei (TW); Shih-Yi Wen, Taipei (TW); Chun-Che Lee, Taipei (TW)

(73) Assignee: Helio Optoelectronics Corporation, Hsinchu County (TW)

( * ) Notice: Subject to any disclaimer, the term of this patent is extended or adjusted under 35 U.S.C. 154(b) by 356 days.

(21) Appl. No.: 12/441,214

(22) PCT Filed: Sep. 13, 2006

(86) PCT No.: PCT/CN2006/002380
§ 371 (c)(1),
(2), (4) Date: Mar. 13, 2009

(87) PCT Pub. No.: WO2008/031281
PCT Pub. Date: Mar. 20, 2008

(65) Prior Publication Data
US 2010/0060131 A1    Mar. 11, 2010

(51) Int. Cl.
*H01J 61/52*   (2006.01)
*H01J 5/50*   (2006.01)

(52) U.S. Cl. ................................ 313/46; 313/318.05
(58) Field of Classification Search ............... 313/46, 313/318.05; 257/79, 88, 99
See application file for complete search history.

(56) References Cited

U.S. PATENT DOCUMENTS 6,841,799 B2 * 1/2005 Arthur et al. .................. 257/81
7,224,000 B2 * 5/2007 Aanegola et al. ............. 257/98
* cited by examiner

*Primary Examiner* — Matthew W Such
*Assistant Examiner* — Monica D Harrison
(74) *Attorney, Agent, or Firm* — Stites & Harbison, PLLC; Juan Carlos A. Marquez, Esq.

(57) ABSTRACT

An LED bulb structure having an insertion end includes a first electrically conducting pin, a second electrically conducting pin having a die pad at an end thereof, and an LED unit electrically connected to the first electrically conducting pin and the second electrically conducting pin through a first leading wire and a second leading wire, respectively, and a cap enclosing the above-mentioned components and leaving part of the first electrically conducting pin and the second electrically conducting pin exposed thereoutside. The first and second electrically conducting pins are adapted to form bayonet connections. An LED bulb structure having a heat dissipation element has the heat dissipation element attached to the pin portions of the electrically conducting pins. An LED bulb structure having a heat-and-electricity separated element further has a thermally conducting pin.

17 Claims, 11 Drawing Sheets

LED BULB STRUCTURE HAVING INSERTION END, AND/OR HEAT DISSIPATION ELEMENT, AND/OR HEAT-AND-ELECTRICITY SEPARATED ELEMENT

BACKGROUND OF THE INVENTION

1. Technical Field

The present invention relates to high-power LED structures, and more particularly, to an insertion-type LED lamp comprising formed as a single package operable in high-voltage environments with significantly-enhanced heat dissipation ability and adaptive to various existing lamp holders. The disclosed LED bulb structure has an insertion end, and/or a heat dissipation element, and/or a heat-and-electricity separated element.

2. Description of Related Art

U.S. Pat. No. 6,709,132 has disclosed an LED bulb comprising a printed circuit board which is flat when developed and is bendable to form a cage, a plurality of LEDs which are disposed on the printed circuit board, and a transparent or semi-transparent cover which encloses the printed circuit board formed into the cage. The printed circuit board may have a plurality of belt-like branches which extend in radial directions from the center of the printed circuit board. The LED bulb may further comprise a power unit housing for containing a power unit which supplies electric current to each of the LEDs.

U.S. Pat. No. 6,793,374 has disclosed an LED lamp having a gear column, which is connected between a cap and substrates. The substrates are arranged as a polyhedron with planar surfaces. Each surface has at least one LED. The gear column also has a heat-dissipater, which interconnects the substrates and the lamp cap.

U.S. Pat. No. 6,598,996 has disclosed a light emitting diode lamp for use in a brake light bulb socket of an automobile. The light emitting diode lamp has first and second printed circuit boards having first and second pluralities of light emitting diodes mounted thereupon for emitting monochromatic light in response to power signals supplied from the automobile. The light emitting diode lamp further includes a body adapted to form a bayonet connection, a base having at least one contact, and a support sleeve having a wiring conduit, a support tray, and at least two support stanchions for supporting the first printed circuit board. Finally, the light emitting diode lamp includes at least one resistor electrically connected between the at least one contact and a first wire that is electrically connected to the first and second printed circuit boards.

The aforesaid prior art devices are merely adaptive to either screw lamp holders or brake light bulb sockets of vehicles and are undesirably bulky. Besides, in view of the fact that there are many existing types of lamp holders, for resource saving and environmental protection, it is desired that an LED light is more compact, more operable in high-voltage environments and more adaptive to existing lamp holders.

Thus, to remedy the inconvenience and defects reflected in their configurations and applications, the existing LED bulb structures need to be improved. Although all relevant manufactures have saved no efforts to solve the aforementioned problems, an applicable approach has not been developed. It is still a challenge for the manufacturers to provide an appropriate structure to all related products with the attempt solving the aforementioned problems. Hence, creation of a novel LED bulb structure having an insertion end, a novel LED bulb structure having a heat dissipation element and a novel LED bulb structure having a heat-and-electricity separated element has become an immediate R&D task and a common goal of the industry.

Considering the defects of the known LED bulb structures, the inventor of the present invention, aiming at creating a novel LED bulb structure having an insertion end, a novel LED bulb structure having a heat dissipation element and a novel LED bulb structure having a heat-and-electricity separated element that reform the defects of the existing LED bulb structures and possess improved practicality, and basing on his years of practical experience and professional knowledge in designing and manufacturing this product, has applied appropriate theories and performing active researches and innovation. After unceasing researches and repeated retrofit, the inventor herein discloses the present invention that exactly provides practical utility.

SUMMARY OF THE INVENTION

The primary objective of the present invention is to provide an LED bulb structure having an insertion end, an LED bulb structure having a heat dissipation element and an LED bulb structure having a heat-and-electricity separated element so as to remedy the defects of the conventional products by making the LED bulb structures operable in high-voltage environments and adaptive to various existing lamp holders, thus being more practical.

Another objective of the present invention is to provide an LED bulb structure having an insertion end, an LED bulb structure having a heat dissipation element and an LED bulb structure having a heat-and-electricity separated element so as to remedy the defects of the conventional products by making the LED bulb structures have significantly enhanced heat dissipation efficiency. Therefore, the LED bulb structures can normally operate in high-voltage environments, thus being more practical.

To achieve the objectives of the present invention, the disclosed LED bulb structure having the insertion end comprises: a first electrically conducting pin including a first unit and a second unit; a second electrically conducting pin including a third unit and a fourth unit, wherein a die pad is settled at an end of the third unit; an LED unit settled on the die pad and having one end electrically connected to the first electrically conducting pin through a first leading wire and an opposite end electrically connected to the second electrically conducting pin through a second leading wire; and a cap enclosing the first unit, the third unit, the die pad, the LED unit, the first leading wire and the second leading wire, and leaving the second unit and the fourth unit exposed thereoutside. The LED bulb structure is characterized by that the first and second electrically conducting pins are adapted to form bayonet connections.

To achieve the objectives of the present invention and solve the technical problems of the prior arts, the following means are proposed in the present invention.

In the aforesaid LED bulb structure having the insertion end, a light extracting layer or a wavelength converting layer is further arranged on the die pad.

In the aforesaid LED bulb structure having the insertion end, the electrically conducting pins are bayonet pins selected from models of G4, G5.3, G6.35, G7.9, G9, G9.5, GU4, GU5.3, GX5.3, GX6.35, GX7.9, GY5.3, GY6.35, GY7.9, GY9.5, GZ4, GZ6.36 or GZ9.5.

In the aforesaid LED bulb structure having the insertion end, the LED unit is a high-voltage LED unit.

To achieve the objectives of the present invention, the disclosed LED bulb structure having the heat dissipation element comprises: a first electrically conducting pin including a first unit and a second unit; a second electrically conducting pin including a third unit and a fourth unit, wherein a die pad is settled at an end of the third unit; an LED unit settled on the die pad and having one end electrically connected to the first electrically conducting pin through a first leading wire and an opposite end electrically connected to the second electrically conducting pin through a second leading wire; a cap enclosing the first unit, the third unit, the die pad, the LED unit, the first leading wire and the second leading wire, and leaving the second unit and the fourth unit exposed thereoutside, and a first heat dissipation element, being the heat dissipation element, and such connected with the second unit and the fourth unit in a thermally conductive manner that pin portions formed at ends of the second unit and the fourth unit, respectively, are exposed outside the first heat dissipation element.

To achieve the objectives of the present invention and solve the technical problems of the prior arts, the following means are proposed in the present invention.

In the aforesaid LED bulb structure having the heat dissipation element, a light extracting layer or a wavelength converting layer is further arranged on the die pad.

In the aforesaid LED bulb structure having the heat dissipation element, the pin portions are adapted to form bayonet connections.

In the aforesaid LED bulb structure having the heat dissipation element, the LED unit is a high-voltage LED unit.

In the aforesaid LED bulb structure having the heat dissipation element, the first heat dissipation element has a finned body.

In the aforesaid LED bulb structure having the heat dissipation element, the first heat dissipation element is made of metal or a ceramic material possessing high thermal conductivity.

In the aforesaid LED bulb structure having the heat dissipation element, thermally conducting adhesive or soldering tin is applied between the first heat dissipation element and the second unit or the fourth unit to provide functions of bonding and thermally conductive joining.

To achieve the objectives of the present invention, the disclosed LED bulb structure having the heat-and-electricity separated element comprises: a first electrically conducting pin including a first unit and a second unit; a second electrically conducting pin including a third unit and a fourth unit; a thermally conducting pin including a fifth unit and a sixth unit, wherein a die pad is settled at an end of the fifth unit; an LED unit settled on the die pad and having one end electrically connected to the first electrically conducting pin through a first leading wire and an opposite end electrically connected to the second electrically conducting pin through a second leading wire; and a cap enclosing the first unit, the third unit, the fifth unit, the die pad, the LED unit, the first leading wire and the second leading wire, and leaving the second unit, the fourth unit, and the sixth unit exposed thereoutside.

To achieve the objectives of the present invention and solve the technical problems of the prior arts, the following means are proposed in the present invention.

In the aforesaid LED bulb structure having the heat-and-electricity separated element, the thermally conducting pin is shaped as a plate, a pillar, a column, or a finned body.

In the aforesaid LED bulb structure having the heat-and-electricity separated element, a light extracting layer or a wavelength converting layer is further arranged on the die pad.

In the aforesaid LED bulb structure having the heat-and-electricity separated element, the pin portions are adapted to form bayonet connections.

In the aforesaid LED bulb structure having the heat-and-electricity separated element, the LED unit is a high-voltage LED unit.

In the aforesaid LED bulb structure having the heat-and-electricity separated element, a second heat dissipation element, such connected with the sixth unit in a thermally conductive manner that pin portions formed at ends of the second unit and the fourth unit, respectively, are exposed outside the second heat dissipation element.

In the aforesaid LED bulb structure having the heat-and-electricity separated element, the second heat dissipation element is made of metal or a ceramic material possessing high thermal conductivity.

In the aforesaid LED bulb structure having the heat-and-electricity separated element, the second heat dissipation element has a finned body.

In the aforesaid LED bulb structure having the heat-and-electricity separated element, thermally conducting adhesive or soldering tin is applied between the second heat dissipation element and the sixth unit to provide functions of bonding and thermally conductive joining.

As compared with the conventional devices, the present invention provides evident advantages and beneficial effects. Through the previously described configurations, the LED bulb structure having the insertion end, the LED bulb structure having the heat dissipation element and the LED bulb structure having the heat-and-electricity separated element of the present invention provide at least the following virtues and functions.

First, the LED bulb structure having the insertion end, LED bulb structure having the heat dissipation element and LED bulb structure having the heat-and-electricity separated element disclosed herein are adaptive to the existing lamp holders.

Furthermore, the present invention improves the LED bulb structures in heat dissipation efficiency, and thus enables manufacture of high-power and high-illumination LED bulb structures.

Besides, since the present invention improves the LED bulb structures in heat dissipation efficiency, the resultant high-power and high-illumination LED bulb structures are more compact and less bulky as compared with the existing products.

To sum up, the present invention provides an LED bulb structure having an insertion end, an LED bulb structure having a heat dissipation element and an LED bulb structure having a heat-and-electricity separated element. The LED bulb structure having the insertion end comprises a first electrically conducting pin, a second electrically conducting pin having a die pad at an end thereof, and an LED unit electrically connected to the first electrically conducting pin and the second electrically conducting pin through a first leading wire and a second leading wire, respectively, and a cap enclosing the above-mentioned components and leaving part of the first electrically conducting pin and the second electrically conducting pin exposed thereoutside. The LED bulb structure having the insertion end is characterized by that the first and second electrically conducting pins are adapted to form bayonet connections. The LED bulb structure having the heat dissipation element is characterized by the heat dissipation element attached to exposed portions of the electrically conducting pins. The LED bulb structure having the heat-and-electricity separated element is characterized by the thermally conducting pin. Thereby, an LED bulb structure according to the present invention can be formed as a single package like a bulb that is convenient to replace and use while providing improved heat dissipation efficiency. The present invention allows an LED bulb structure to be formed as a single package operable in high-voltage environments and applicable to various existing lamp holders, thus being very practical. Besides, the present invention significantly improves LED bulb structures in heat dissipation efficiency, so as to allow the LED bulb structures to normally operation in high-voltage environments and thus to be more practical. The present invention provides improvements and outstanding virtues, and thus is more practical and industrially applicable. Therefore, the subject matter of the present invention is exactly novel, advanced and functional.

While the above description is merely a summary of the technical approach according to the present invention, for further illustrating the technical means proposed by the present invention allowing people skilled in the art to use the present invention, and clarifying the above and other objectives, features and advantages of the present invention, some preferred embodiments will be given below with reference to the accompanying drawings.

Figure 1:
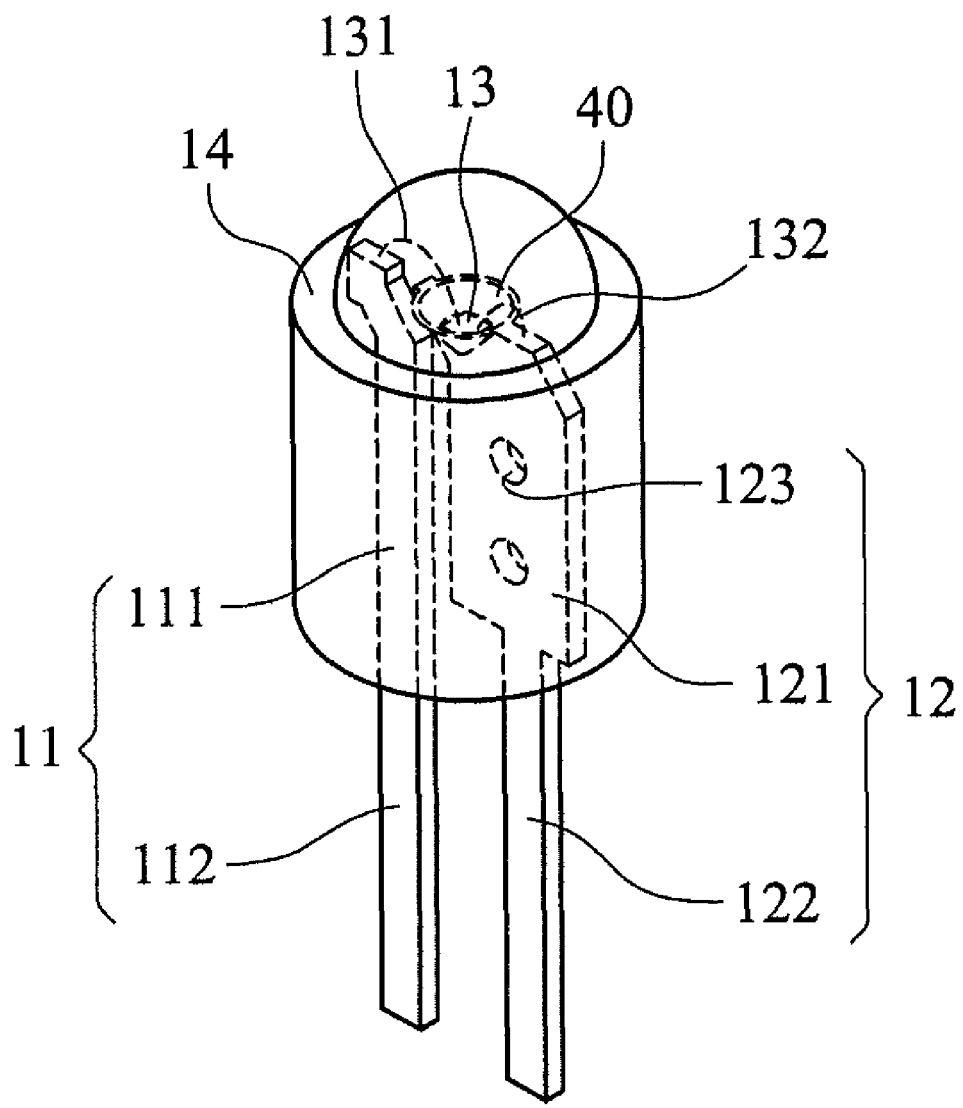
FIG. 1 is a schematic drawing of an LED bulb structure having an insertion end according to one aspect of a first embodiment of the present invention.

10: LED bulb structure having insertion end
10': LED bulb structure having insertion end
11, 11': first electrically conducting pin
111: first unit
112: second unit
12, 12': second electrically conducting pin
121: third unit
122: fourth unit
123: reinforcing member
13: LED unit
131: first leading wire
132: second leading wire
14: cap
20: LED bulb structure having a heat dissipation element
20': LED bulb structure having a heat dissipation element
21: first heat dissipation element
211: first channel
212: second channel
30: LED bulb structure having a heat-and-electricity separated element
31: thermally conducting pin
311: fifth unit
312: sixth unit
32: second heat dissipation element
321: third channel
40: die pad
50: pin portions

DETAILED DESCRIPTION OF THE PREFERRED EMBODIMENT

To further illustrate the technical means and effects provided by the present invention to achieve the intended objective, the specific means, configurations, features and virtues of the LED bulb structure having the insertion end, LED bulb structure having the heat dissipation element and LED bulb structure having the heat-and-electricity separated element proposed by the present invention will be explained below through the preferred embodiments with reference to the accompanying drawings.

First Preferred Embodiment

Figure 2:
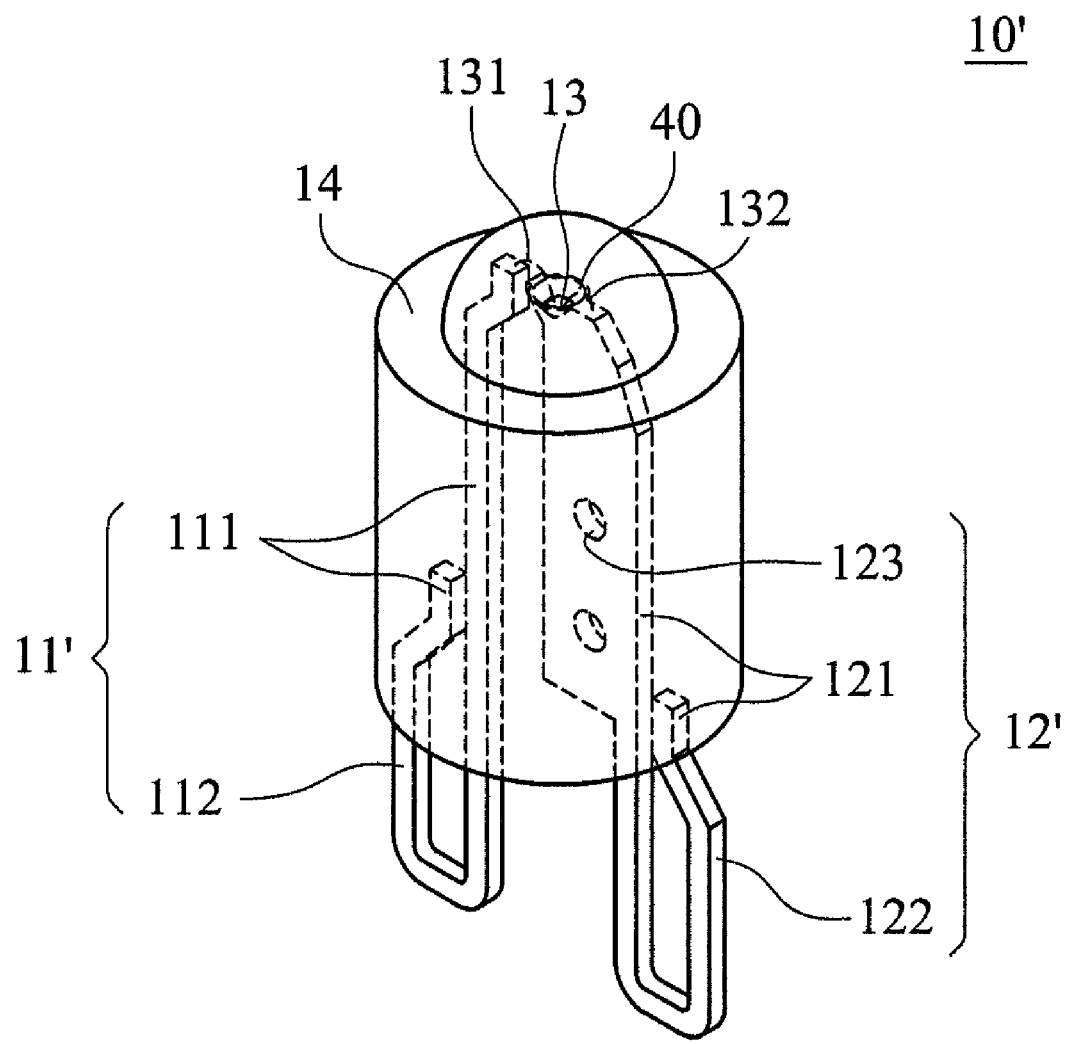
FIG. 2 is a schematic drawing of an LED bulb structure having an insertion end according to another aspect of the first embodiment of the present invention.

Please refer to FIGS. 1 and 2 for an LED bulb structure 10 having an insertion end according to one aspect of a first embodiment of the present invention and an LED bulb structure 10' having an insertion end according to another aspect of the first embodiment of the present invention.

The LED bulb structure 10 having the insertion end comprises a first electrically conducting pin 11, a second electrically conducting pin 12, an LED unit 13 and a cap 14. The LED bulb structure 10 is characterized by that the first and second electrically conducting pins 11, 12 are adapted to form bayonet connections.

The first electrically conducting pin 11 made of a material having excellent electrical conductivity includes a first unit 111 and a second unit 112. The first unit 111 and a third unit 121 to be described below are enclosed by the cap 14 while the second unit 112 and a fourth unit 122 to be described below are not enclosed by the cap 14.

The second electrically conducting pin 12 made of a material having excellent electrical and thermal conductivity includes a third unit 121 and a fourth unit 122, wherein the third unit 121 has an end formed with a die pad 40. The die pad 40 is made of the same material forming the second electrically conducting pin 12 and formed integrally with the second electrically conducting pin 12. The second electrically conducting pin 12 may be formed similar to the first electrically conducting pin 11 in shape, or may be formed with a plate portion.

In production of the first electrically conducting pin 11 or the second electrically conducting pin 12, at least one reinforcing member 123, such as a recess, at least one depressed portion, at least one raised portion, or a structure having an irregular shape, may be formed on the first unit 111 or the third unit 121. Thereby, after the cap 14 is formed, combination firmness between the cap 14 and the first or second electrically conducting pin, 11 or 12, is further ensured.

The LED unit 13 may be an ordinary LED, or, may be particularly a high-voltage LED unit. The so-called high-voltage LED unit refers to an LED structure composed of a plurality of light-emitting diodes connected in series or composed of a plurality of light-emitting diodes and impedance elements connected in series, and adaptive to a wide range of operational voltages. The LED unit 13 settled on the die pad 40 has one end electrically connected to the first electrically conducting pin 11 through a first leading wire 131 and an opposite end electrically connected to the second electrically conducting pin 12 through a second leading wire 132. Through the first electrically conducting pin 11 and the second electrically conducting pin 12, power can be delivered to the LED unit 13 by way of the first leading wire 131 and the second leading wire 132, so as to enable the LED unit 13 to emit light. After installation of the LED unit 13 and formation of wiring bonding, a light extracting layer or a wavelength converting layer may be further arranged on the die pad 40 (not shown).

The cap 14 is made of a transparent material and encloses the first unit 111, the third unit 121, the die pad 40, the LED unit 13, the first leading wire 131 and the second leading wire 132 while leaving the second unit 112 and the fourth unit 122 exposed thereoutside. Thereby, the LED bulb structure 10 is completely formed.

To facilitate adapting LED bulb structures to the existing lamp holders that has been conventionally and extensively used, it is desired that LED bulb structures are made into single packages like light bulbs, so as to be immediately coupled with the existing lamp holders. The present embodiment is characterized by that the conducting pins of the LED bulb structure 10 are bayonet pins compatible to the standards applied to lighting products but not the traditionally used solder pins to be soldered with a PCB. In other words, the first and second electrically conducting pins 11, 12 have a distance therebetween and respective dimensions (e.g. length, width, diameter, etc.) compatible to the standards applied to lighting products while the components of the LED bulb structure 10 other than the first and second electrically conducting pins 11, 12 are variable according to practical needs. It is the bayonet pins compatible to the standards applied to lighting products that achieve the bayonet connections and make the LED bulb structure 10 have insertion ends.

More particularly, the bayonet pins may be any one of G4, G5.3, G6.35, G7.9, G9, G9.5, GU4, GU5.3, GX5.3, GX6.35, GX7.9, GY5.3, GY6.35, GY7.9, GY9.5, GZ4, GZ6.36 and GZ9.5, which are known models of bayonet pins in the art.

Second Preferred Embodiment

Figure 3:
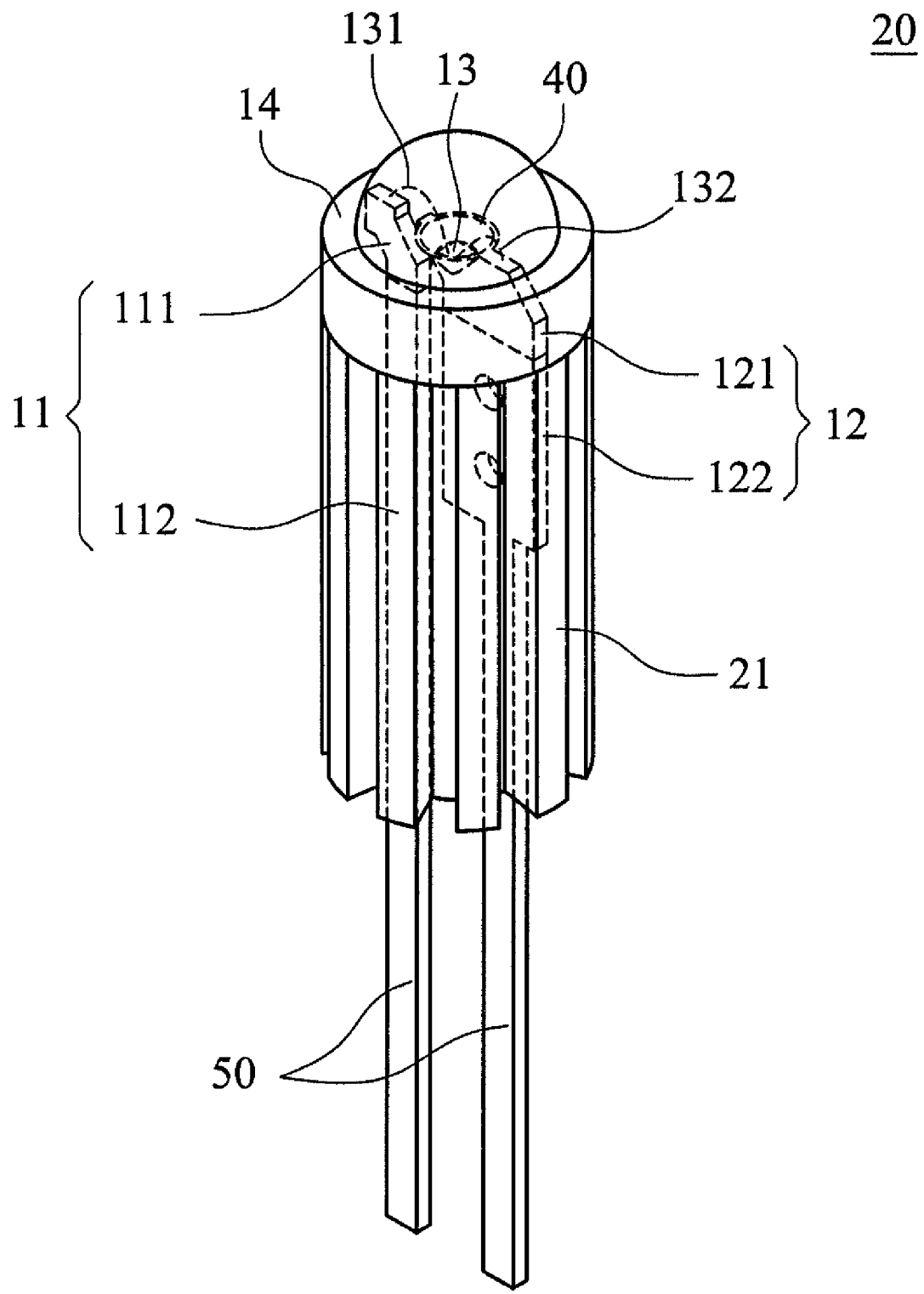
FIG. 3 is a schematic drawing of an LED bulb structure having a heat dissipation element according to one aspect of a second embodiment of the present invention, wherein a first heat dissipation element is provided.
Figure 4:
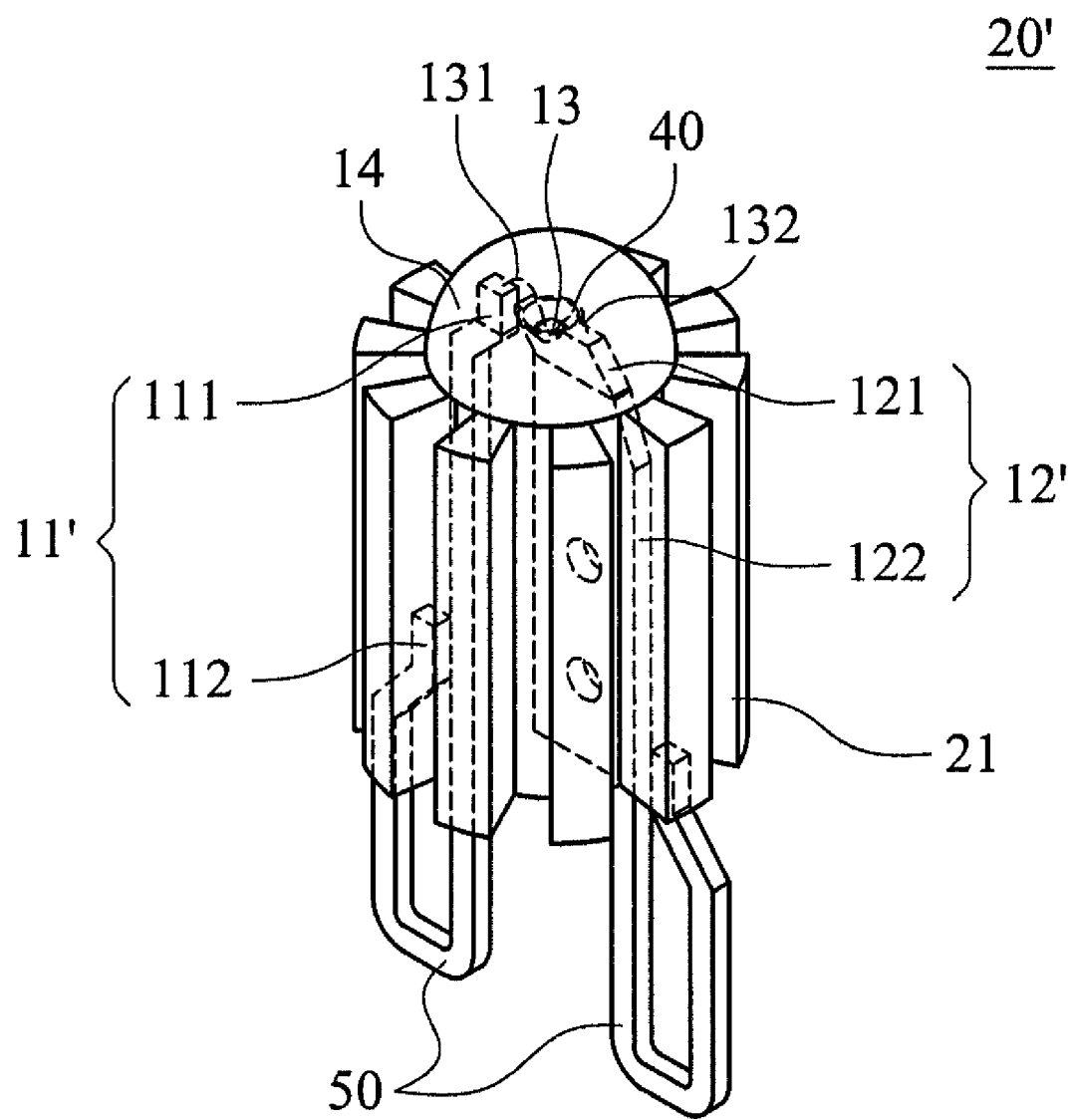
FIG. 4 is a schematic drawing of an LED bulb structure having a heat dissipation element according to another aspect of the second embodiment of the present invention, wherein a first heat dissipation element is provided.
Figure 5:
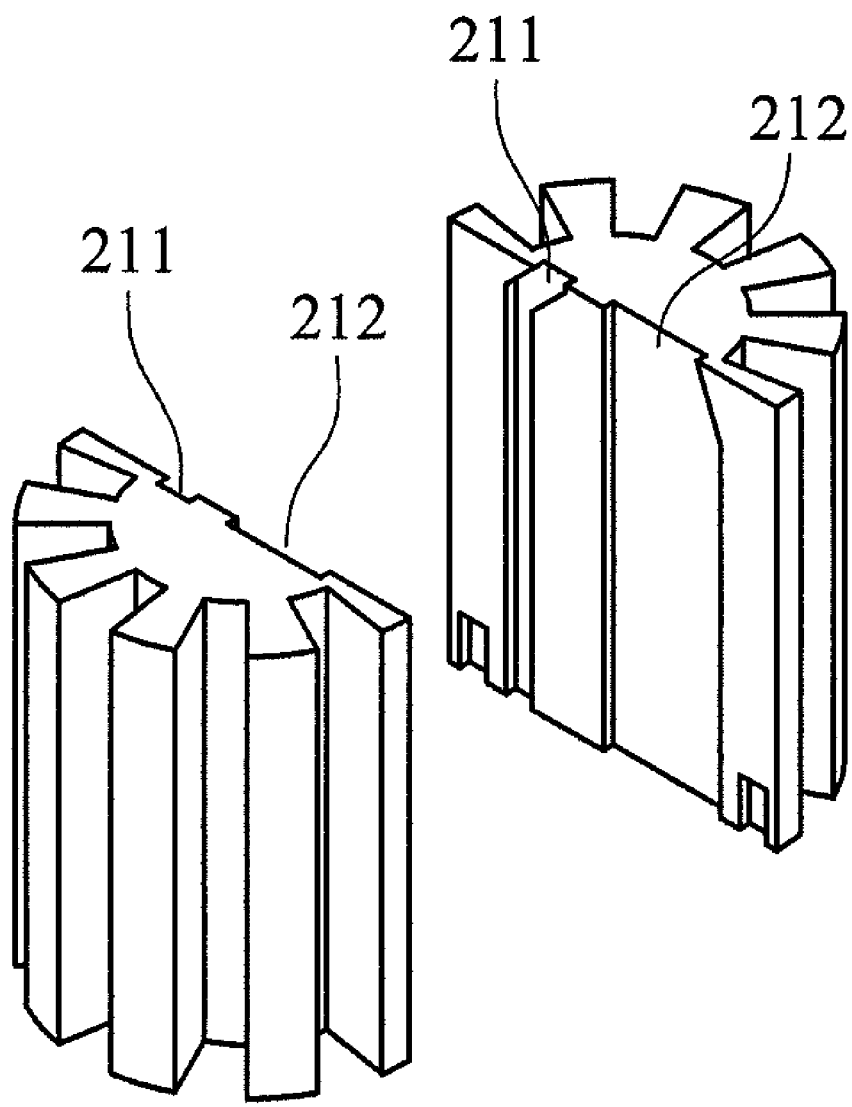
FIG. 5 is a schematic drawing of the first heat dissipation element.

Please refer to FIGS. 3, 4 and 5 for an LED bulb structure 20 having a first heat dissipation element according to one aspect of a second embodiment of the present invention, an LED bulb structure 20' having a first heat dissipation element 21 according to another aspect of the second embodiment of the present invention, and the first heat dissipation element 21.

The LED bulb structure 20 having the first heat dissipation element comprises a first electrically conducting pin 11, a second electrically conducting pin 12, an LED unit 13, a cap 14, and the first heat dissipation element 21.

The first electrically conducting pin 11 made of a material having excellent electrical conductivity includes a first unit 111 and a second unit 112. The first unit 111 and a third unit 121 to be described below are enclosed by the cap 14 while the second unit 112 and a fourth unit 122 to be described below are not enclosed by the cap 14.

The second electrically conducting pin 12 made of a material having excellent electrical and thermal conductivity includes a third unit 121 and a fourth unit 122, wherein the third unit 121 has an end formed with a die pad 40. The die pad 40 is made of the same material forming the second electrically conducting pin 12 and formed integrally with the second electrically conducting pin 12. The second electrically conducting pin 12 may be formed similar to the first electrically conducting pin 11 in shape, or may be formed with a plate portion.

In production of the first electrically conducting pin 11 or the second electrically conducting pin 12, at least one reinforcing member as that described in the first embodiment may be formed on the first unit 111 or the third unit 121. Thereby, after the cap 14 is formed, combination firmness between the cap 14 and the first or second electrically conducting pin, 11 or 12, is further ensured.

The LED unit 13 may be an ordinary LED, or, may be particularly a high-voltage LED unit. The so-called high-voltage LED unit refers to an LED structure composed of a plurality of light-emitting diodes connected in series or composed of a plurality of light-emitting diodes and impedance elements connected in series, and adaptive to a wide range of operational voltages. The LED unit 13 settled on the die pad 40 has one end electrically connected to the first electrically conducting pin 11 through a first leading wire 131 and an opposite end electrically connected to the second electrically conducting pin 12 through a second leading wire 132. Through the first electrically conducting pin 11 and the second electrically conducting pin 12, power can be delivered to the LED unit 13 by way of the first leading wire 131 and the second leading wire 132, so as to enable the LED unit 13 to emit light. After installation of the LED unit 13 and formation of wiring bonding, a light extracting layer or a wavelength converting layer may be further arranged on the die pad 40 (not shown).

The cap 14 is made of a transparent material and encloses the first unit 111, the third unit 121, the die pad 40, the LED unit 13, the first leading wire 131 and the second leading wire 132 while leaving the second unit 112 and the fourth unit 122 exposed thereoutside. Thereby, the LED bulb structure 20 is completely formed.

The first heat dissipation element 21 has first channels 211 and second channels 212 forming openings that fittingly receive the second unit 112 and the fourth unit 122 passing therethrough so that thermally conducting combination between the first heat dissipation element 21 and the fourth unit 122 can be effectively achieved. Besides, for effectively diffusing heat, the first heat dissipation element 21 is designed as a finned body that provides enlarged heat dissipation area.

Contacting surfaces of the first heat dissipation element 21 and the first electrically conducting pin 11 as well as the second electrically conducting pin 12 have to be processed by means of electric insulating treatment so as to prevent short circuits. Moreover, the first heat dissipation element 21 may be a single piece formed as a whole or a combination of tow or more units. In addition, the first heat dissipation element 21 is particularly made of metal, such as copper or aluminum alloy, or ceramic materials possessing high thermal conductivity, such as aluminum nitride or boron nitride.

For not hindering assembly between the LED bulb structure 20 and a lamp holder, the first heat dissipation element 21 is such arranged that pin portions 50 formed at ends of the second unit 112 and the fourth unit 122 are left exposed thereoutside. The pin portions 50 of the LED bulb structure 20 having the first heat dissipation element 21 may act as solder pins to be soldered with a PCB. Alternatively, the pin portions 50 may be bayonet pins as described in the first preferred embodiment, so that the LED bulb structure 20 can be immediately coupled with a lamp holder. Besides, a thermally conducting adhesive or soldering tin may be applied between the first heat dissipation element 21 and the second unit 112 or the fourth unit 122 to provide functions of bonding and thermally conductive joining.

Third Preferred Embodiment

Figure 6:
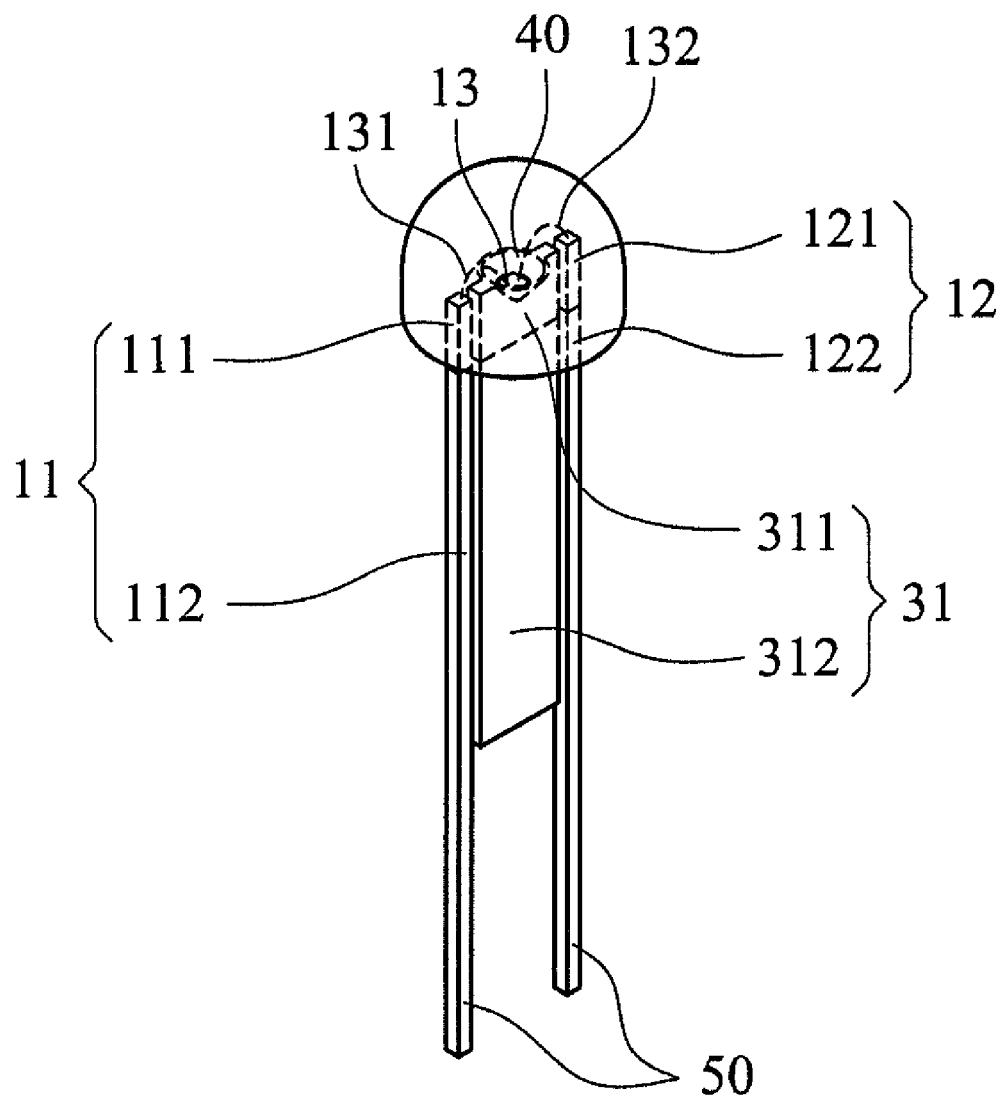
FIG. 6 is a partial drawing of an LED bulb structure having a heat-and-electricity separated element according to one aspect of a third embodiment of the present invention.
Figure 7:
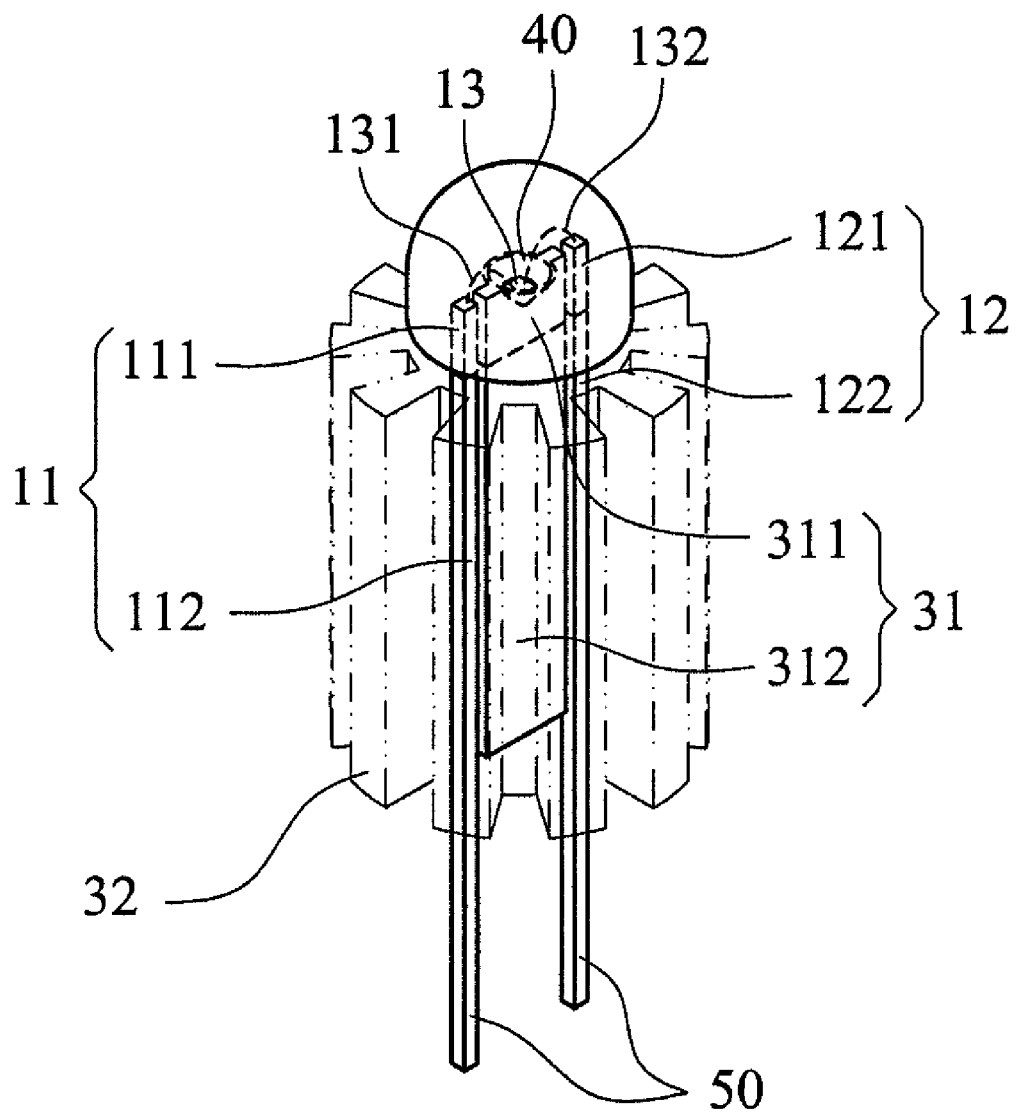
FIG. 7 is a schematic drawing of an LED bulb structure having a heat-and-electricity separated element according to another aspect of the third embodiment of the present invention.
Figure 8:
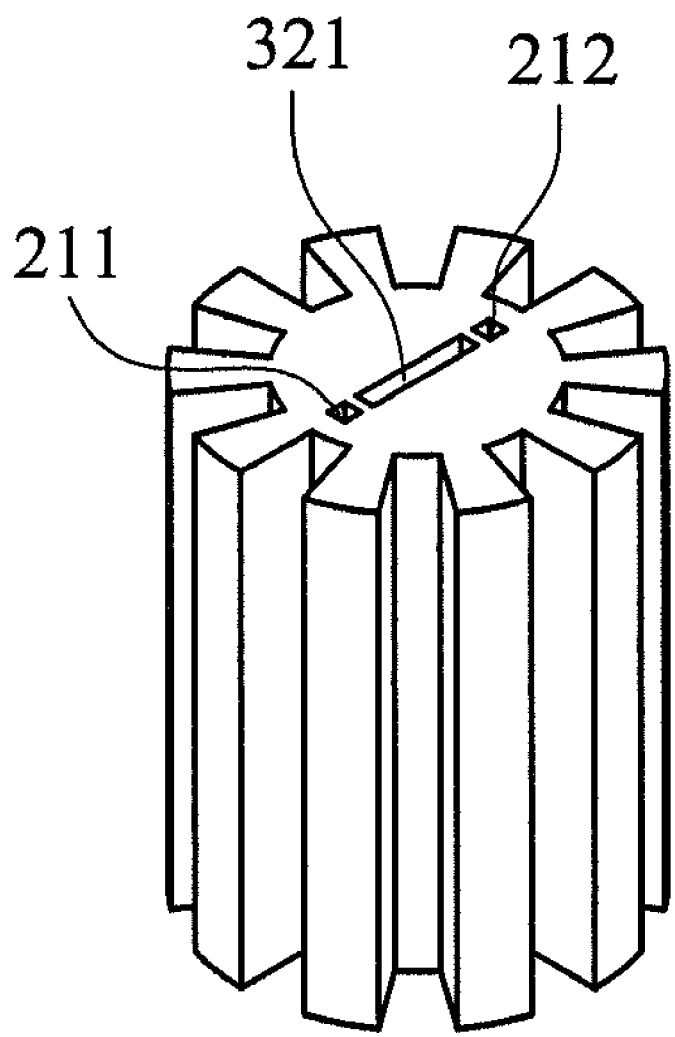
FIG. 8 is a schematic drawing of a second heat dissipation element.

Please refer to FIGS. 6, 7, and 8 for an LED bulb structure 30 having a heat-and-electricity separated element according to one aspect of a third embodiment of the present invention, an LED bulb structure 30 having a heat-and-electricity separated element according to another aspect of the third embodiment of the present invention, and a second heat dissipation element 32.

The LED bulb structure 30 having a heat-and-electricity separated element comprises a first electrically conducting pin 11, a second electrically conducting pin 12, a thermally conducting pin 31, an LED unit 13 and a cap 14.

The first electrically conducting pin 11 made of a material having excellent electrical conductivity includes a first unit 111 and a second unit 112. The first unit 111 and a third unit 121 as well as a fifth unit 311 to be described below are enclosed by the cap 14 while the second unit 112 and a fourth unit 122 as well as a sixth unit 312 to be described below are not enclosed by the cap 14.

The second electrically conducting pin 12 made of a material having excellent electrical and thermal conductivity includes a third unit 121 and a fourth unit 122. In production of the first electrically conducting pin 11 or the second electrically conducting pin 12, at least one reinforcing member as that described in the first embodiment may be formed on the first unit 111, the third unit 121, or the fifth unit 311 to be described below. Thereby, after the cap 14 is formed, combination firmness between the cap 14 and the first or second electrically conducting pin, 11 or 12, is further ensured.

The thermally conducting pin 31 includes the fifth unit 311 and the sixth unit 312, wherein a die pad 40 is formed at an end of the fifth unit 311. The die pad 40 is made of the same material forming the thermally conducting pin 31 and formed integrally with the thermally conducting pin 31. Generally, the thermally conducting pin 31 may be a plate, a pillar, a column, a finned body, and so on as long as heat generated at the die pad 40 can be effectively conducted outward.

The LED unit 13 may be an ordinary LED, or, may be particularly a high-voltage LED unit. The so-called high-voltage LED unit refers to an LED structure composed of a plurality of light-emitting diodes connected in series or composed of a plurality of light-emitting diodes and impedance elements connected in series, and adaptive to a wide range of operational voltages. The LED unit 13 settled on the die pad 40 has one end electrically connected to the first electrically conducting pin 11 through a first leading wire 131 and an opposite end electrically connected to the second electrically conducting pin 12 through a second leading wire 132. Through the first electrically conducting pin 11 and the second electrically conducting pin 12, power can be delivered to the LED unit 13 by way of the first leading wire 131 and the second leading wire 132, so as to enable the LED unit 13 to emit light. After installation of the LED unit 13 and formation of wiring bonding, a light extracting layer or a wavelength converting layer may be further arranged on the die pad 40 (not shown).

The cap 14 is made of a transparent material and encloses the first unit 111, the third unit 121, the fifth unit 311, the die pad 40, the LED unit 13, the first leading wire 131 and the second leading wire 132 while leaving the second unit 112, the fourth unit 122, and the sixth unit 312 exposed thereoutside. Thereby, the LED bulb structure 30 is completely formed.

For further enhancing thermal conductivity, the thermally conducting pin 31 may have the second heat dissipation element 32 attached thereto. The second heat dissipation element 32 has therein a third channel 321 for fittingly receiving the sixth unit 312 passing therethrough so that thermally conducting combination between the second heat dissipation element 32 and the sixth unit 312 can be effectively achieved. In addition, the second heat dissipation element 32 has therein a first channel 211 and a second channel 212 for fittingly receiving the second unit 112 and the fourth unit 122 passing therethrough so that the second heat dissipation element 32 can get coupled with the LED bulb structure 30.

Contacting surfaces between the second heat dissipation element 32 and the first electrically conducting pin 11 as well as the second electrically conducting pin 12 or contacting surfaces between the second heat dissipation element 32 and the first electrically conducting pin 11, the second electrically conducting pin 12, as well as the thermally conducting pin 31 have to be processed by means of electric insulating treatment so as to prevent short circuits. Moreover, the second heat dissipation element 32 may be a single piece formed as a whole or a combination of tow or more units. In addition, the second heat dissipation element 32 is particularly made of metal, such as copper or aluminum alloy, or ceramic materials possessing high thermal conductivity, such as aluminum nitride or boron nitride.

Besides, for effectively diffusing heat, the second heat dissipation element 32 is designed as a finned body that provides enlarged heat dissipation area. For not hindering assembly between the LED bulb structure 30 and a lamp holder, the second heat dissipation element 32 is such arranged that pin portions 50 formed at ends of the second unit 112 and the fourth unit 122 are left exposed thereoutside. The pin portions 50 of the LED bulb structure 30 having the heat-and-electricity separated element may act as solder pins to be soldered with a PCB. Alternatively, the pin portions 50 may be bayonet pins as described in the first embodiment, so that the LED bulb structure 30 can be immediately coupled with a lamp holder. Besides, a thermally conducting adhesive or soldering tin may be applied between the second heat dissipation element 32 and the thermally conducting pin 31 to provide functions of bonding and thermally conductive joining.

Figure 9A:
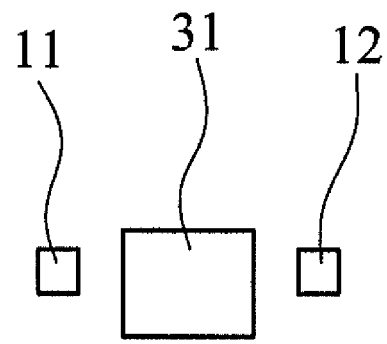
FIG. 9A and FIGS. 9C to 9H provides tops views of different arrangements of electrically conducting pins and thermally conducting pin according to the present invention.
Figure 9B:
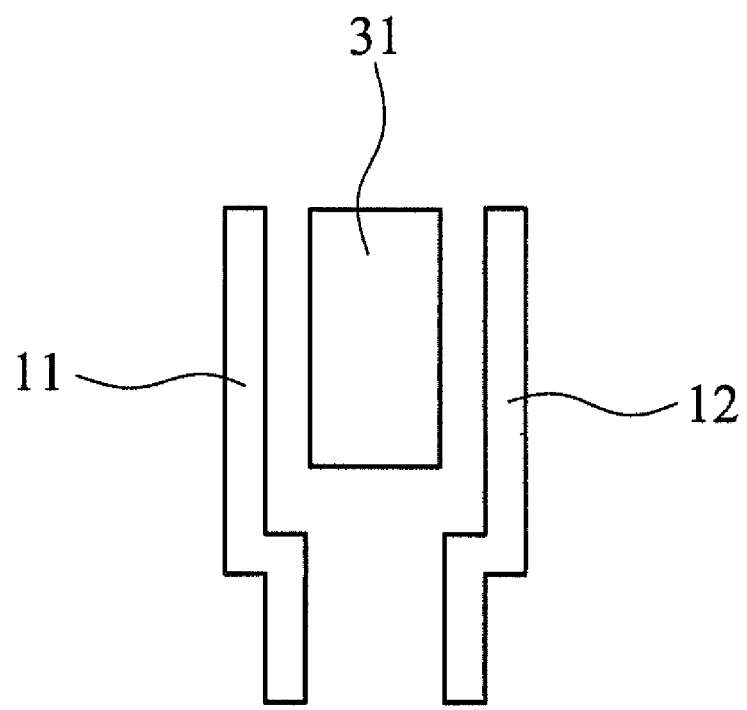
FIG. 9B is a front view of the electrically conducting pins and thermally conducting pin of FIG. 9A.
Figure 9C:
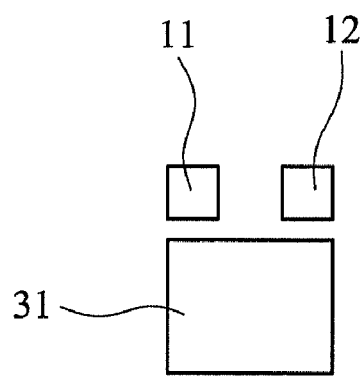
Figure 9D:
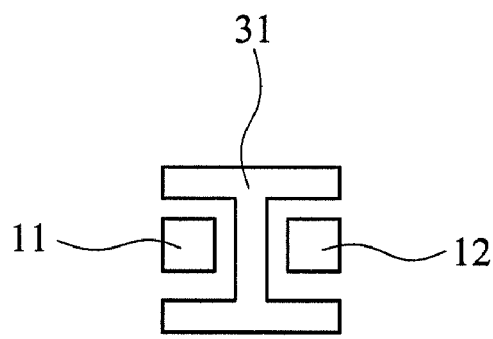
Figure 9E:
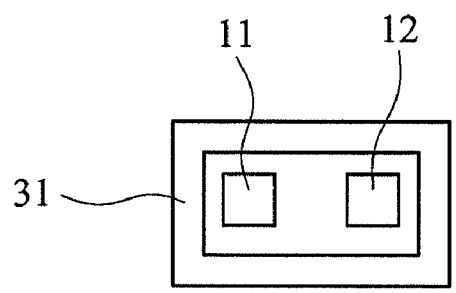
Figure 9F:
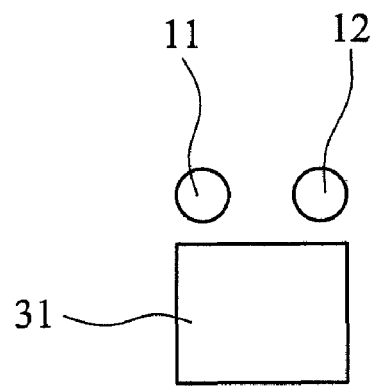
Figure 9G:
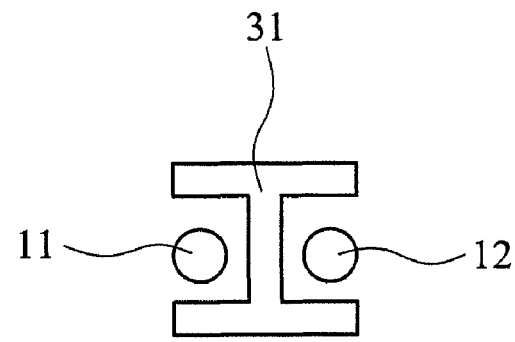
Figure 9H:
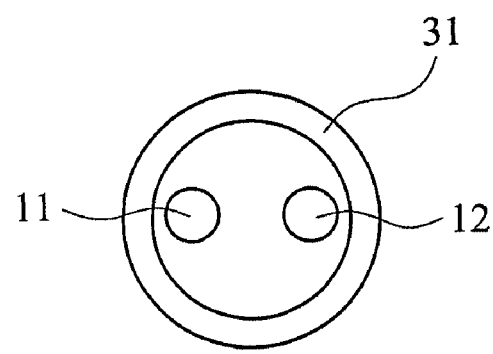

Please refer to FIGS. 9A through 9H for different arrangements of electrically conducting pins and thermally conducting pin 31 in the LED bulb structure 30 having the heat-and-electricity separated element according to the present invention. Therein, FIG. 9B is a front view of the structure of FIG. 9A. For catering for all levels of heat dissipation, the LED bulb structure 30 having the heat-and-electricity separated element may have the thermally conducting pin 31 arranged differently as shown in FIGS. 9A to 9H. According to the top views in FIG. 9A and FIGS. 9C to 9H, the first electrically conducting pin 11, the second electrically conducting pin 12, and the thermally conducting pin 31 may have portions thereof that are enclosed by the cap 14 or the second heat dissipation element 32 configured into various arrangements so as to allow the LED bulb structure 30 having the heat-and-electricity separated element to have improved design flexibility in the first electrically conducting pin 11, the second electrically conducting pin 12, and the thermally conducting pin 31. However, when the LED bulb structure 30 having the heat-and-electricity separated element has insertion ends, to ensure the portions of the second unit 112 and the fourth unit 122 of the first electrically conducting pin 11 and the second electrically conducting pin 12 that are not enclosed by the cap 14 or the pin portions 50 that are not enclosed by the second heat dissipation element 32 are compatible to the standards applied to lighting products, the first electrically conducting pin 11 and the second electrically conducting pin 12 must have their lower portion recessed, as shown in FIG. 9B. On the other hand, for being compatible to the standards applied to lighting products of the insertion ends, positional exchange between the thermally conducting pin 31 having large area or volume and the first electrically conducting pin 11 as well as the second electrically conducting pin 12 may be necessary so that the second unit 112 and the fourth unit 122 of the first electrically conducting pin 11 and the second electrically conducting pin 12 or the pin portions 50 can be coupled with the socket of a conventional lamp holder.

The present invention has been described with reference to the preferred embodiment and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

INDUSTRIAL APPLICABILITY

As compared with the conventional devices, the present invention provides evident advantages and beneficial effects. Through the previously described configurations, the LED bulb structure, LED bulb structure having the heat dissipation element and LED bulb structure having the heat-and-electricity separated element of the present invention provide at least the following virtues and functions.

First, the present invention provides the LED bulb structure having the first and second electrically conducting pins adapted to form bayonet connections, the disclosed LED bulb structure having the heat dissipation element attached to the exposed portions of the electrically conducting pins, and the LED bulb structure having the heat-and-electricity separated element further having the thermally conducting pin. Thereby, the LED bulb structures of the present invention are singled packages formed as light bulbs that are convenient to replace and use while providing improved heat dissipation efficiency.

Secondly, the LED bulb structure having the insertion end, LED bulb structure having the heat dissipation element and LED bulb structure having the heat-and-electricity separated element disclosed herein are adaptive to the existing lamp holders.

Furthermore, the present invention improves the LED bulb structures in heat dissipation efficiency, and thus enables manufacture of high-power and high-illumination LED bulb structures.

Besides, since the present invention improves the LED bulb structures in heat dissipation efficiency, the resultant high-power and high-illumination LED bulb structures are more compact and less bulky as compared with the existing products.

To sum up, the present invention provides LED bulb structures that are formed as single packages for being immediately applicable to existing lamp holder and significantly and have excellent heat dissipation efficiency so as to be operable in high-voltage environments, thereby ensuring practicability and industrial applicability of the present invention.

What is claimed is:

1. An LED bulb structure having an insertion end, comprising:
   a first electrically conducting pin including a first unit and a second unit;
   a second electrically conducting pin including a third unit and a fourth unit;
   at least one reinforcing member formed on at least one of the first unit and the third unit;
   a die pad settled at an end of the third unit;
   an LED unit settled on the die pad while having one end electrically connected to the first electrically conducting pin through a first leading wire and an opposite end electrically connected to the second electrically conducting pin through a second leading wire; and
   a transparent cap packaging and enclosing the first unit, the third unit, the at least one reinforcing member, the die pad, the LED unit, the first leading wire, and the second leading wire, while leaving the second unit and the fourth unit exposed thereoutside;
   wherein the first and second electrically conducting pins are adapted to form bayonet connections.

2. The LED bulb structure having the insertion end of claim 1, wherein a light extracting layer or a wavelength converting layer is further arranged on the die pad.

3. The LED bulb structure having the insertion end of claim 1, wherein each of the electrically conducting pins is a bayonet pin of a model of G4, G5.3, G6.35, G7.9, G9, G9.5, GU4, GU5.3, GX5.3, GX6.35, GX7.9, GY5.3, GY6.35, GY7.9, GY9.5, GZ4, GZ6.36 or GZ9.5.

4. The LED bulb structure having the insertion end of claim 1, wherein the LED unit is a high-voltage LED unit.

5. An LED bulb structure having a heat dissipation element, comprising:
   a first electrically conducting pin including a first unit and a second unit;
   a second electrically conducting pin including a third unit and a fourth unit;
   at least one reinforcing member formed on at least one of the first unit and the third unit;
   a die pad settled at an end of the third unit;
   an LED unit settled on the die pad while having one end electrically connected to the first electrically conducting pin through a first leading wire and an opposite end electrically connected to the second electrically conducting pin through a second leading wire;
   a transparent cap packaging and enclosing the first unit, the third unit, the die pad, the LED unit, the first leading wire and the second leading wire, while leaving the second unit and the fourth unit exposed thereoutside; and
   a first heat dissipation element, being the heat dissipation element and made of metal, and such connected with the second unit and the fourth unit in a thermally conductive manner that pin portions formed at ends of the second unit and the fourth unit, respectively, are exposed outside the first heat dissipation element;
   wherein the first heat dissipation element has at least one first channel for receiving the second unit to pass through and at least one second channel for receiving the fourth unit to pass through, the first heat dissipation element is made of metal, and the surfaces of the first heat dissipation element and the first electrically conducting pin contacting with each other as well as the surfaces of the first heat dissipation element and the second electrically conducting pin contacting with each other are processed by means of electric insulating treatment.

6. The LED bulb structure having the heat dissipation element of claim 5, wherein a light extracting layer or a wavelength converting layer is further arranged on the die pad.

7. The LED bulb structure having the heat dissipation element of claim 5, wherein the pin portions are adapted to form bayonet connections.

8. The LED bulb structure having the heat dissipation element of claim 5, wherein the LED unit is a high-voltage LED unit.

9. The LED bulb structure having the heat dissipation element of claim 5, wherein the first heat dissipation element has a finned body.

10. The LED bulb structure having the heat dissipation element of claim 5, wherein thermally conducting adhesive or soldering material is applied between the first heat dissipation element and the second unit or the fourth unit to provide functions of bonding and thermally conductive joining.

11. An LED bulb structure having a heat-and-electricity separated element, comprising:
a first electrically conducting pin including a first unit and a second unit;
a second electrically conducting pin including a third unit and a fourth unit;
a thermally conducting pin including a fifth unit and a sixth unit;
at least one reinforcing member formed on at least one of the first unit, the third unit, and the fifth unit;
a die pad settled at an end of the fifth unit;
an LED unit settled on the die pad while having one end electrically connected to the first electrically conducting pin through a first leading wire and an opposite end electrically connected to the second electrically conducting pin through a second leading wire;
a transparent cap packaging and enclosing the first unit, the third unit, the fifth unit, the die pad, the LED unit, the first leading wire and the second leading wire while leaving the second unit, the fourth unit, and the sixth unit exposed thereoutside; and
a heat dissipation element, connected with the sixth unit in a thermally conductive manner that pin portions formed at ends of the second unit and the fourth unit, respectively, are exposed outside the second heat dissipation element; and
wherein the heat dissipation element has at least one first channel for receiving the second unit to pass through, at least one second channel for receiving the fourth unit to pass through, and at least one third channel for receiving the sixth unit to pass through, the heat dissipation element is made of metal, and the surfaces of the heat dissipation element and the first electrically conducting pin contacting with each other and the surfaces of the heat dissipation element and the second electrically conducting pin contacting with each other are processed by means of electric insulating treatment.

12. The LED bulb structure having the heat-and-electricity separated element of claim 11, wherein the thermally conducting pin is shaped as a plate, a pillar, a column, or a finned body.

13. The LED bulb structure having the heat-and-electricity separated element of claim 11, wherein a light extracting layer or a wavelength converting layer is further arranged on the die pad.

14. The LED bulb structure having the heat-and-electricity separated element of claim 11, wherein the pin portions are adapted to form bayonet connections.

15. The LED bulb structure having the heat-and-electricity separated element of claim 11, wherein the LED unit is a high-voltage LED unit.

16. The LED bulb structure having the heat-and-electricity separated element of claim 11, wherein the heat dissipation element has a finned body.

17. The LED bulb structure having the heat-and-electricity separated element of claim 11, wherein thermally conducting adhesive or soldering material is applied between the heat dissipation element and the sixth unit to provide functions of bonding and thermally conductive joining.

* * * * *